United States Patent
Lochtefeld et al.

(10) Patent No.: US 6,838,728 B2
(45) Date of Patent: Jan. 4, 2005

(54) BURIED-CHANNEL DEVICES AND SUBSTRATES FOR FABRICATION OF SEMICONDUCTOR-BASED DEVICES

(75) Inventors: Anthony J. Lochtefeld, Cambridge, MA (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/216,091

(22) Filed: Aug. 9, 2002

(65) Prior Publication Data

US 2003/0052406 A1 Mar. 20, 2003

Related U.S. Application Data

(60) Provisional application No. 60/311,186, filed on Aug. 9, 2001.

(51) Int. Cl.[7] .......................... H01L 23/48; H01L 23/52; H01L 29/40
(52) U.S. Cl. ....................... 257/325; 257/758
(58) Field of Search ................. 257/750, 758, 257/743, 744, 101, 185, 191, 335, 325

(56) References Cited

U.S. PATENT DOCUMENTS

| | | | |
|---|---|---|---|
| 5,136,603 A | * | 8/1992 | Hasnain et al. |
| 5,221,413 A | | 6/1993 | Brasen et al. |
| 5,442,205 A | | 8/1995 | Brasen et al. |
| 5,698,900 A | * | 12/1997 | Bozada et al. |
| 5,872,382 A | * | 2/1999 | Schwalke et al. |
| 5,906,951 A | | 5/1999 | Chu et al. ............. 438/751 |
| 6,154,475 A | * | 11/2000 | Soref et al. |
| 6,160,274 A | * | 12/2000 | Folkes |
| 6,515,335 B1 | * | 2/2003 | Christiansen et al. |
| 6,555,839 B2 | * | 4/2003 | Fitzgerald |

FOREIGN PATENT DOCUMENTS

| | | |
|---|---|---|
| EP | 0323896 B1 | 7/1989 |
| EP | 0494395 B1 | 7/1992 |
| EP | 0494395 A2 | 7/1992 |
| EP | 0494395 A3 | 7/1992 |
| EP | 0683522 A2 | 11/1995 |
| EP | 1020900 A2 | 7/2000 |
| EP | 1020900 A3 | 9/2000 |
| EP | 1174928 A1 | 1/2002 |
| WO | WO 0054338 | 9/2000 |

OTHER PUBLICATIONS

Maiti et al., "Strained–Si Heterostructure Field Effect Transistors" *Semiconductor Science and Technology, Institute of Physics*, London, Nov. 1998, vol. 13, No. 11, pp. 1225–1246.

* cited by examiner

*Primary Examiner*—S. V. Clark
(74) *Attorney, Agent, or Firm*—Testa Hurwitz & Thibeault LLP

(57) ABSTRACT

Semiconductor-based devices, and methods for making the devices, involve a first device that includes a buried channel layer, a dielectric layer, and a compositionally graded spacer layer. The spacer layer includes a first material and a second material, and is located between the buried channel layer and the dielectric layer. A second device includes a buried channel layer, a relaxed surface layer, and a spacer layer located between the buried channel layer and the relaxed surface layer. The spacer layer has a composition that is different from a composition of the relaxed layer. The spacer layer and the relaxed surface layer each have bandgap offsets relative to the buried channel layer to reduce a parasitic channel conduction. A substrate for fabrication of devices, and methods for making the substrate, involves a substrate that includes a first layer, such as a silicon wafer, a substantially uniform second layer, and a graded-composition third layer.

35 Claims, 11 Drawing Sheets

BURIED-CHANNEL DEVICES AND SUBSTRATES FOR FABRICATION OF SEMICONDUCTOR-BASED DEVICES

RELATED APPLICATIONS

This application claims benefit of U.S. Provisional Patent Application Ser. No. 60/311,186, filed Aug. 9, 2001, the entire contents of which are incorporated herein by reference.

TECHNICAL FIELD

The invention generally relates to semiconductor devices, and, more particularly, to transistors that include buried channel layers.

BACKGROUND INFORMATION

Some semiconductor devices include a buried channel. A metal-oxide-semiconductor field-effect transistor (MOSFET) that includes a buried channel, for example, can have advantages over a surface-channel MOSFET. For example, a buried-channel MOSFET can have low noise because channel conduction occurs in a layer that is spaced from a dielectric interface.

Buried-channel transistors can include semiconductor layers of a variety materials, such as, silicon, germanium, GaAs, InP, InGaAs, AlGaAs, etc. Devices that include SiGe alloys are presently of particular interest for potential improvements over conventional device performance. Both buried channel layers and surface channel layers can be formed on substrates having a relaxed SiGe layer. These channel layers can provide improved carrier mobility in comparison to convention silicon channel devices.

Buried-channel devices, however, lack good compatibility with traditional MOSFET fabrication methods. Traditional surface-channel MOSFET fabrication typically entails formation of a silicon dioxide ($SiO_2$) gate insulator via thermal oxidation of a silicon surface. For example, a buried silicon channel with a SiGe alloy overlayer having a significant Ge concentration generally will not yield a high-quality thermally grown insulator-semiconductor interface via oxidation of the SiGe overlayer.

A silicon capping layer can be included during fabrication, to support thermal-oxide formation. A silicon cap, however, can cause formation of an undesirable parasitic surface channel in a buried layer device. When the device is "on" (i.e. gate bias above threshold voltage) there can be significant electron confinement in the portion of the surface silicon cap that remains after oxide formation. The parasitic surface channel can decrease effective mobility and degrade noise performance of the MOSFET.

One possible solution to this problem is minimization of the thickness of the silicon cap that remains after thermal oxidation. If the surface electron "well" is very thin, electrons can be excluded from the surface silicon region. This solution can be difficult to implement because of the extremely high degree of precision and repeatability it would demand.

If the surface cap is deposited with too little thickness, the cap can be insufficient for the growth of a good quality $SiO_2$ gate insulator. If oxidation of a silicon cap leaves too much remaining silicon, or no remaining silicon, a parasitic layer or a poor oxide can result. Thus, a flexible process window can be elusive in a production environment.

SUMMARY OF THE INVENTION

The invention, in part, features buried-channel devices and methods of fabricating such devices, which reduce surface layer parasitic channels while providing good thermal oxide formation. A buried-channel device can include a compositionally graded spacer layer to substantially eliminate a parasitic surface layer. Alternatively, a buried-channel device can include a spacer layer and a relaxed surface layer; a bandgap offset between the relaxed surface layer and the buried channel layer can substantially eliminate a parasitic surface layer. The invention also, in part, relates to a lower-cost relaxed substrate layer, which can be used for fabrication of surface and buried-channel devices.

In one illustrative embodiment, a buried channel layer is formed along with a silicon surface capping layer and an intermediate, compositionally graded spacer layer. The graded layer, for example, is an alloy of silicon and germanium having a silicon concentration that increases as the capping layer is approached. Thus, for example, an oxidation process window can be targeted to consume the entire silicon capping layer. If a thin portion of silicon remains, a very good oxide interface can be obtained with too little remaining silicon capping layer thickness to produce a significant parasitic channel.

If the silicon surface layer is entirely consumed, along with a small portion of the graded spacer layer, good oxide can still be obtained because the upper portion of the graded layer has a small germanium concentration. Similarly, the oxide interface can be good, again due to the low germanium concentration. Further, the compositional grading of germanium in the spacer layer can prevent formation of a significant parasitic channel. Thus, a relatively large process window for oxide formation is obtained.

In another illustrative embodiment, a buried-channel device includes a buried strained-silicon channel, a SiGe alloy spacer layer and a relaxed-silicon surface layer. A bandgap offset between the relaxed-silicon surface layer and the buried strained-silicon channel layer substantially eliminates a parasitic surface channel. A compressive stress in the spacer layer can help prevent relaxation-related dislocations from extending from the surface and spacer layers into the buried channel layer.

In another illustrative embodiment, a substrate includes a lower-cost SiGe substrate layer, which is formed on a silicon wafer. The substrate layer can support, for example, fabrication of surface-channel and/or buried-channel devices.

A lower portion of the SiGe substrate layer has a uniform composition, while an upper portion is compositionally graded. The uniform portion has a germanium concentration of, e.g., approximately 10 atomic %, so that an effectively low density of dislocations is produced by formation of the uniform portion. The total thickness of the SiGe substrate layer is less than would arise from a fully graded substrate layer. Thus, for example, the substrate can have a reduced cost.

Accordingly, in a first aspect, the invention features a semiconductor-based device. The device includes a buried channel layer, a dielectric layer, and a compositionally graded spacer layer. The spacer layer includes a first material and a second material, and is located between the buried channel layer and the dielectric layer.

The atomic percentage of the second material can be smaller at a location proximal to the dielectric layer than at a location distal to the dielectric layer. The grading of the second material in the spacer layer can enhance interfacial compatibility with the dielectric layer and restrict parasitic surface channel formation. The atomic percentage of the second material can increase linearly with increasing distance from the dielectric layer.

The buried channel layer can be formed from the first material. The first material can be silicon and the second material can be germanium.

The device can include a surface layer formed, preferably, of strained silicon. The surface layer, if present, is preferably very thin, for example, a thickness of less than approximately 1 nm. Preferably, the dielectric layer is formed via thermal oxidation of the surface layer, to form, for example, silicon dioxide. The surface layer can be entirely consumed; in some cases, a portion of the spacer layer is also consumed during dielectric layer formation.

In a second aspect, the invention features a method for fabricating a semiconductor-based device. The method includes provision of a buried channel layer, provision of a graded spacer layer, provision of a surface layer, and reaction of the surface layer to form a dielectric layer. Formation of the dielectric layer can target reaction of all of, or nearly all of, the surface layer. For example, a strained-silicon surface layer can be mostly or entirely consumed by thermal oxidation.

In a third aspect, the invention features a semiconductor-based device. The device includes a buried channel layer, a relaxed surface layer, and a spacer layer located between the buried channel layer and the relaxed surface layer. The spacer layer has a composition that is different from a composition of the relaxed layer. The relaxed surface layer has bandgap offsets relative to the buried channel layer to reduce a parasitic channel conduction.

The relaxed surface layer can have dislocations associated with relief of stress induced by a lattice mismatch between the relaxed surface layer and a substrate layer. The thickness of the relaxed surface layer can be greater than its critical thickness, to facilitate strain relaxation of the surface layer.

A portion of the spacer layer can have a compressive strain to block dislocations from extending beyond the relaxed surface layer.

In a fourth aspect, the invention features a method for fabricating a semiconductor-based device. The method includes provision of a buried channel layer, provision of a spacer layer, provision of a strained surface layer, and relaxation of the strained surface layer via dislocation formation, thus forming a relaxed surface layer.

Relaxation of the strained surface layer can be facilitated by increasing the thickness of this layer until the thickness is greater than a critical thickness of the strained surface layer. The strained surface layer can also be heated to facilitate dislocation motion.

The total material thickness of the buried channel layer, the spacer layer, and the strained surface layer is preferably kept less than a critical total thickness (at which point relaxation defects would appear in the buried channel layer). Thus, dislocation formation at an interface of the buried channel layer can be avoided.

A dielectric layer can be obtained, for example, by thermally oxidizing a portion of the relaxed surface layer. If the relaxed surface layer is formed of silicon, for example, an advantageous dielectric interface with the silicon can thus be obtained.

A relaxed-silicon surface layer, for example, has a bandgap offset relative to a buried strained-silicon channel layer. Hence, a parasitic channel is essentially eliminated in the relaxed-silicon surface layer. The surface silicon layer also permits formation of good dielectric material, and a good dielectric interface. A relaxed-silicon surface layer can be provided by using a compressive SiGe spacer layer, and by growing the surface silicon beyond its critical thickness so that it generates dislocations to relieve tensile stress.

In a fifth aspect, the invention features a substrate for fabrication of semiconductor-based devices. The substrate includes a first layer that includes a first material, a second layer that includes the first material and a second material, and a third layer that includes the first and second materials. The second layer has a substantially uniform composition. The third layer has a graded composition of the first and second materials. A composition of the third layer at a location near to the second layer is approximately the same as the composition of the second layer, while a concentration of the second material at a location further from the second layer is greater than a concentration of the second material in the second layer.

The second layer preferably has a thickness that is less than a critical thickness of the second layer. The thickness of the second layer can be less than a thickness of a reference layer having a composition gradient that is the same as a composition gradient of the third layer. The reference layer has a distal composition that is the same as a composition of first layer and has a proximal composition that is the-same as the composition of the third layer at the location proximal to the second layer.

The first material can be silicon and the second material can be germanium. The first layer can be, for example, a silicon wafer. The composition of the second layer can be, for example, 10 atomic % Ge, while the composition of the third layer near its interface with the second layer can also be 10 atomic % Ge. The composition of the third layer can then increase with distance from the second layer.

Thus, for example, a relaxed SiGe layer can be fabricated with a smaller thickness than for a relaxed SiGe layer with a composition that varies continuously from 0% germanium to a maximum germanium concentration.

In a sixth aspect, the invention features a method for manufacturing a substrate that can be utilized in the fabrication of semiconductor-based devices. The method includes formation of a first layer, formation of a second layer, and formation of a third layer.

Thus, for example, a relaxed SiGe substrate layer can be grown more quickly and at lower cost growth by replacing an initial portion of a continuously graded SiGe layer with a thinner portion of SiGe of uniform concentration. For initial portions having a Ge concentration up to, for example, 10%, dislocation concentrations remain acceptably low.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

Various features of the invention are well suited to application in metal-oxide-semiconductor (MOS) transistors having Si, $Si_{1-x}Ge_x$ and/or Ge layers in and/or on a substrate. The term "MOS" is here used to refer generally to semiconductor devices that include a conductive gate spaced at least by an insulting layer from a semiconducting channel layer. The terms "SiGe" and "$Si_{1-x}Ge_x$" are here used interchangeably to refer to silicon-germanium alloys.

Figure 1:
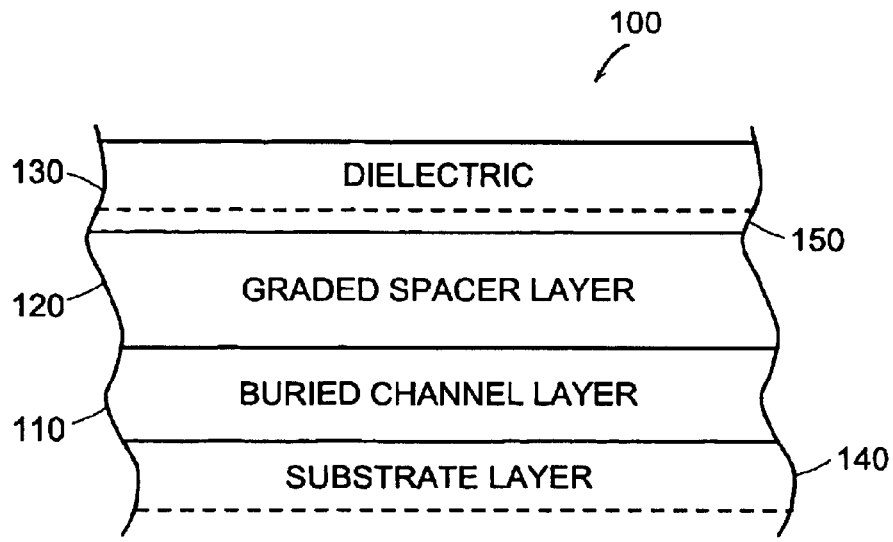
FIG. 1 is a cross-sectional view of a portion of an embodiment of a semiconductor-based device.

Referring to FIG. 1, one aspect of the invention is described in a broad overview. FIG. 1 illustrates a cross-sectional view of a portion of an embodiment of a semiconductor-based device 100. The device 100 includes a buried channel layer 110, a compositionally graded spacer layer 120 and a dielectric layer 130. The device 100 can optionally include a surface layer 150, located between the spacer layer 120 and the dielectric layer 130. The buried channel layer 110 can reside in contact with a substrate layer 140.

Although the various layers of the device 100 can be formed from a variety of materials, the following description will focus on illustrative embodiments that include silicon, germanium and SiGe alloy layers. In one embodiment, the buried channel layer 110 is formed from strained silicon, the graded spacer layer 120 is formed from silicon and germanium, and the dielectric 130 is a thermal oxide, which is formed, at least in part, by oxidation of a surface layer 150 formed from silicon.

The graded spacer layer 120 has a greatest germanium concentration in a lower portion, near the buried channel layer 110, and a relatively low germanium concentration near the dielectric layer 130. For example, the germanium concentration can vary smoothly from a highest value at the interface with the buried channel layer 120 to a lowest value, for example, 0%, at the interface with the dielectric layer.

Figure 2:
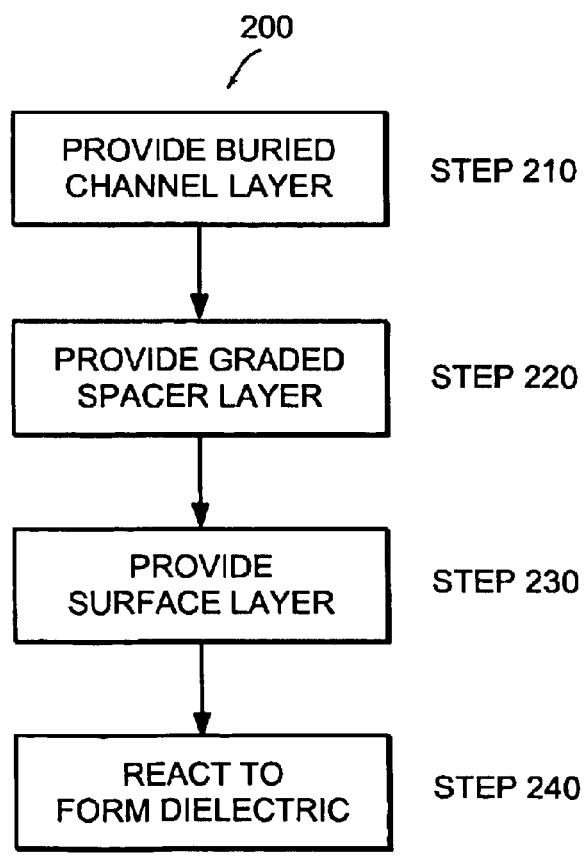
FIG. 2 is a flowchart of an embodiment of a method for fabricating a semiconductor device, such as the device of FIG. 1.

FIG. 2 illustrates an embodiment of a method 200 for fabricating a semiconductor device, such as the device of FIG. 1. The method includes provision of a buried channel layer (STEP 210). The buried channel layer can be, for example, a strained-silicon or SiGe alloy layer, as can be formed via any of a variety of deposition techniques on a relaxed SiGe substrate layer on a silicon wafer. A graded spacer layer is provided adjacent to the buried channel layer (STEP 220). The graded spacer layer includes a first material and a second material. A surface layer, for example, a silicon surface layer, is provided adjacent to the graded spacer layer (STEP 230). The surface layer is reacted to form a dielectric layer (STEP 240). For example, a silicon surface layer can be oxidized to form silicon dioxide.

The surface layer can be fully or partially reacted. If fully reacted, a portion of the graded spacer layer also can be reacted to form a portion of the dielectric layer. A process window can be selected, for example, in which complete oxidation of the surface layer is targeted; a degree of under-shooting or over-shooting the target can be tolerated, according to principles of the invention. The process window can lead to a surface parasitic layer that is thin enough to substantially exclude carriers, and thus provide greater process latitude than some prior designs. This feature of the invention is further described with reference to FIGS. 3A, 3B and 3C.

Figure 3A:
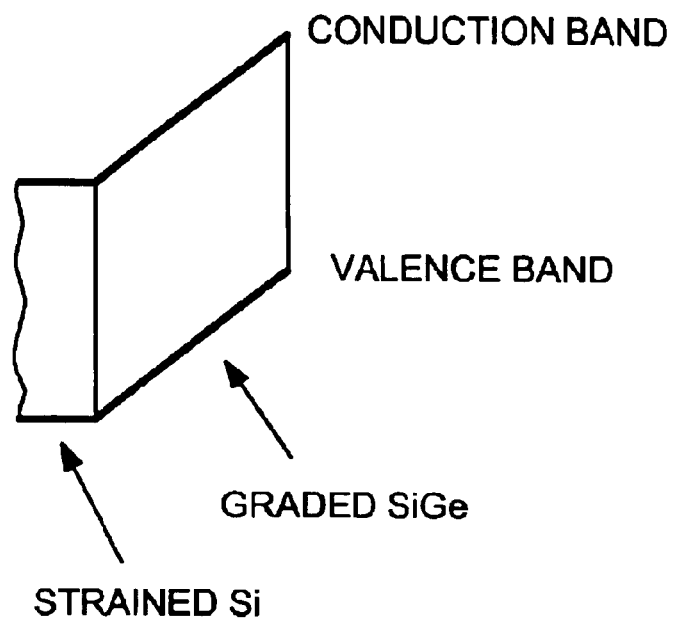
FIGS. 3A, 3B and 3C are band diagrams, with corresponding graphs of germanium composition, for three embodiments of a device at different stages of fabrication.
Figure 3A:
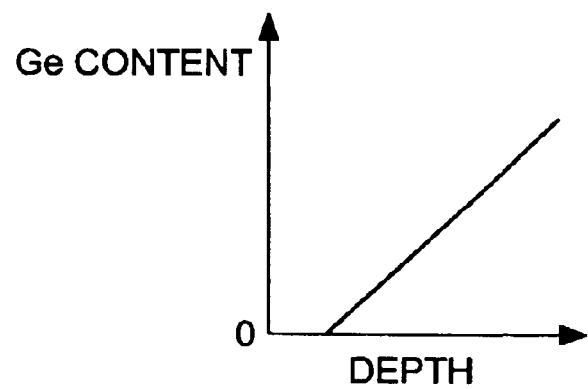
Figure 3B:
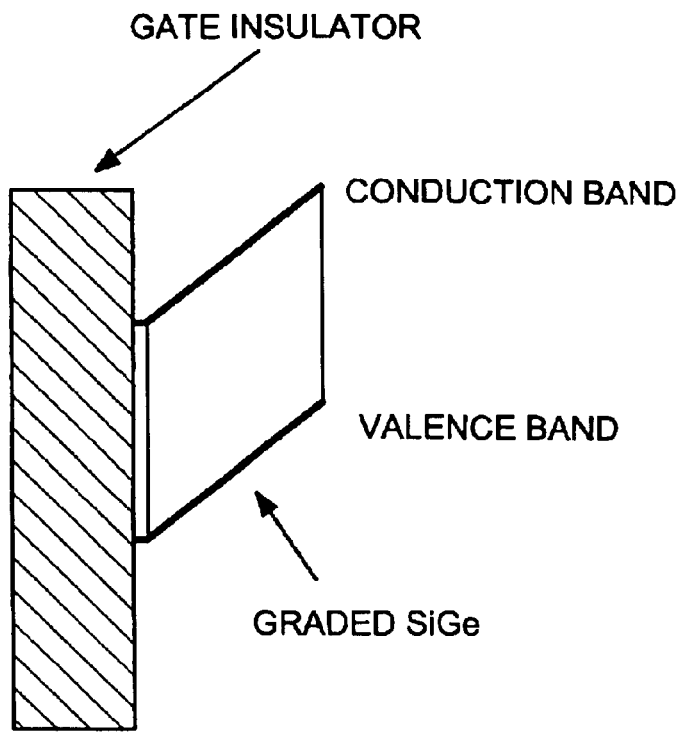
Figure 3B:
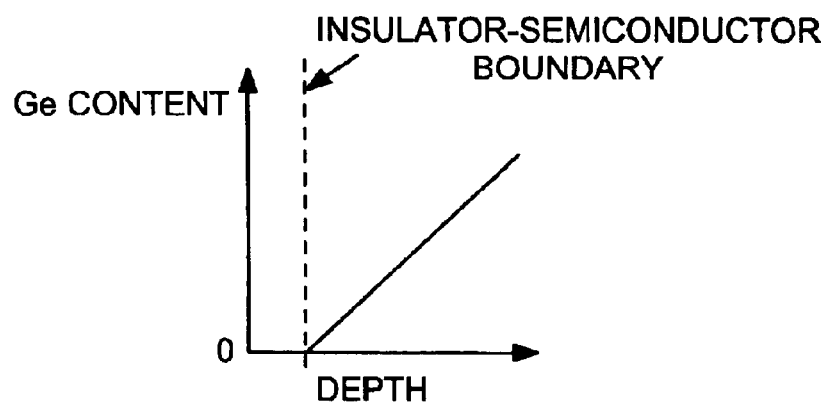
Figure 3C:
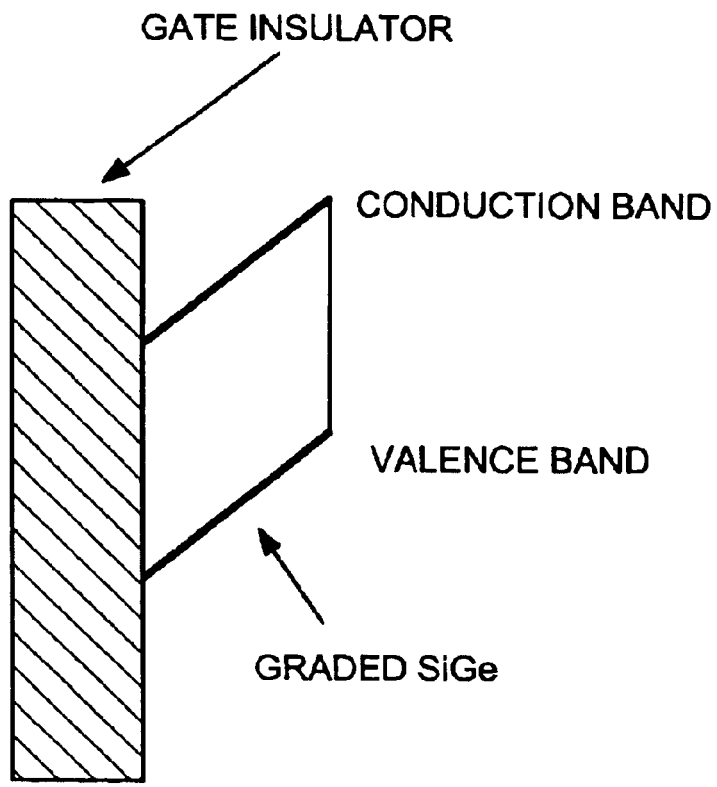
Figure 3C:
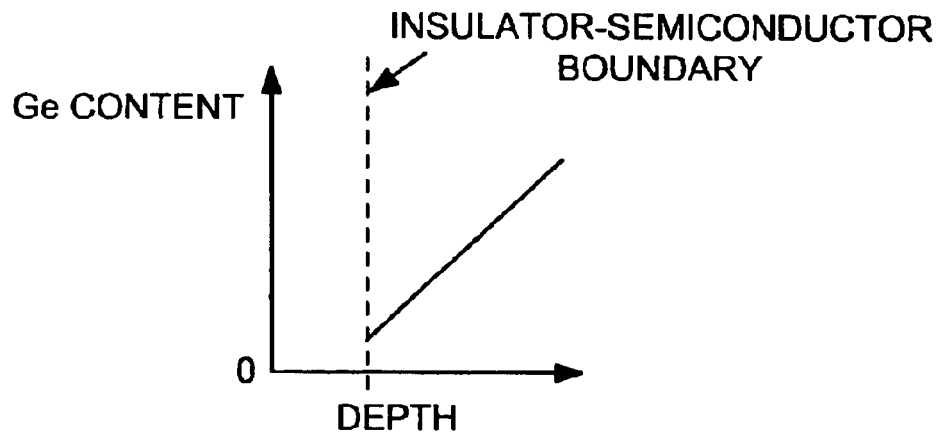

FIGS. 3A, 3B and 3C illustrate band diagrams with corresponding graphs of germanium composition for three embodiments of a device formed from a silicon surface layer and a SiGe alloy graded spacer layer, prior to dielectric reaction (FIG. 3A) and after dielectric reaction (FIGS. 3B and 3C).

FIG. 3A illustrates the band gap and composition of the device immediately prior to reaction to form the dielectric. A strained-silicon surface layer has a thickness, for example, of a few nanometers. The corresponding compositional graph shows the germanium concentration as zero within the surface layer, and as uniformly increasing within the graded SiGe spacer layer with distance from its interface with the surface layer.

FIG. 3B shows one alternative in which dielectric formation has consumed most, but not all, of the silicon surface layer. The thin remaining surface layer material, having a thickness, for example, of approximately 1.0 nm, is thin enough to avoid formation of an undesirable level of surface-channel conduction. Since the oxide shares an interface with silicon, the quality of the interface can be excellent (e.g., extremely low area density of electrical defects).

FIG. 3C shows another alternative, in which dielectric formation has consumed all of the silicon surface layer as well as a thin portion of the graded SiGe spacer layer. Due to the compositional grading of germanium in the graded SiGe spacer layer, the dielectric layer contains an acceptably low concentration of germanium, and the dielectric interface contacts the graded spacer layer at a position that has an acceptably low germanium concentration. Hence, the dielectric quality and the dielectric interface quality remain acceptably good for device performance.

As illustrated, a degree of uncertainty in the dielectric process window can be tolerated. The uncertainty in the process window is related, at least in part, to uncertainty in the reaction process (e.g., uncertainty in the rate of reaction), and to uncertainty in the silicon surface layer deposition process (e.g., uncertainty in the surface layer thickness). Thus, a worst-case effect of the process window uncertainty can be a slight rise in interface state density.

For a buried-channel transistor, a slight rise in interface state density can slightly shift the threshold voltage of the transistor, but can otherwise have a negligible effect on transistor performance. In contrast, an increase in interface state density can be more adverse for a surface-channel device, since the channel carriers reside along the $SiO_2/Si$ interface. In the buried-channel case, the channel carriers are spaced from the dielectric interface, and therefore the main effect of the defect states is generally to shift the threshold voltage, while leaving the carrier mobility substantially unaffected.

The triangular energy-band well, which the graded spacer layer forms for surface carriers, can have an effective thickness that is desirably small. Thus, the formation of a parasitic surface channel layer can be inhibited.

Figure 4:
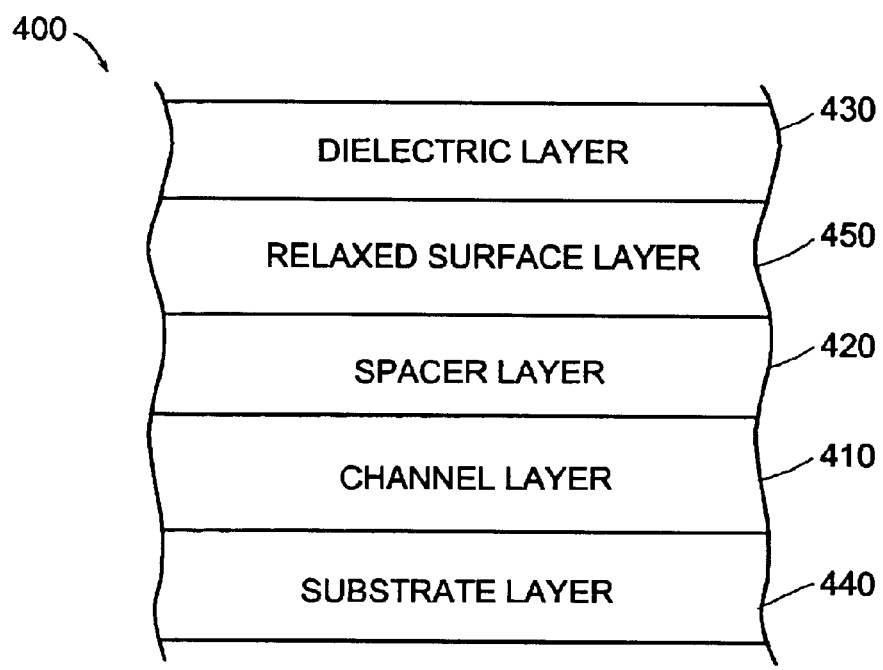
FIG. 4 is a cross-sectional view of a portion of an embodiment of a semiconductor-based device.

Referring to FIG. 4, another broad embodiment of the invention is described. FIG. 4 illustrates a cross-sectional view of a portion of an embodiment of a semiconductor-based device 400. The device 400 includes a buried channel layer 410, a relaxed surface layer 450, and a spacer layer 420 that is intermediate to the buried channel layer 410 and the relaxed surface layer 450. The device 400 can include a dielectric layer 430 in contact with the relaxed surface layer 450. The buried channel layer 410 can reside on a substrate layer 440.

Although the various layers of the device 400 can be formed from a variety of materials, the following description will focus on illustrative embodiments that include silicon, germanium and SiGe alloy layers. In one embodiment, the buried channel layer 410 is formed from strained silicon, the spacer layer 420 is formed from silicon and germanium, and the dielectric 430 is a thermal oxide which is formed, at least in part, by oxidation of a surface layer 450 formed of relaxed silicon.

Figure 5:
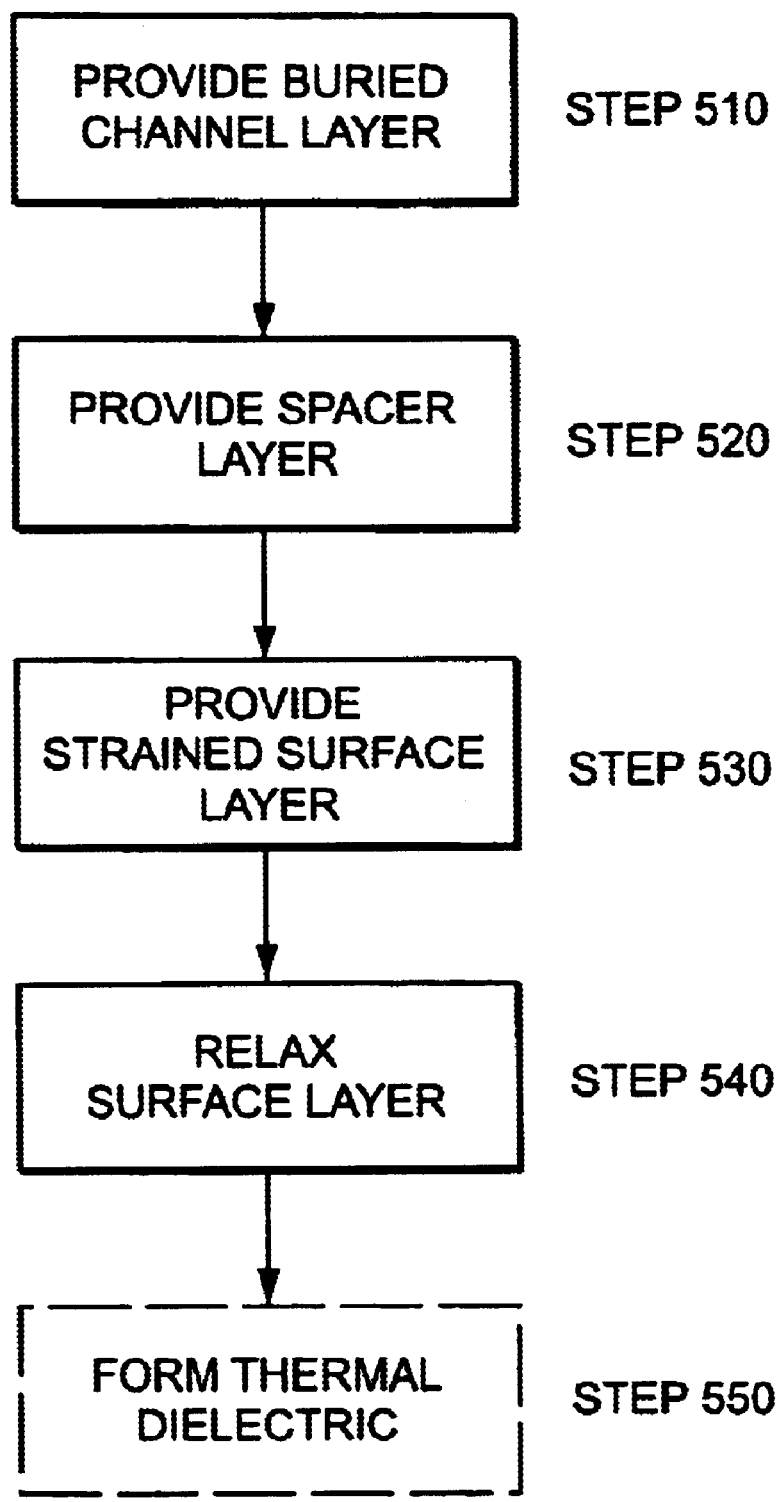
FIG. 5 is a flowchart of an embodiment of a method for fabricating a semiconductor device, such as the device of FIG. 4.

FIG. 5 illustrates a method 500 for fabricating a semiconductor device, such as the device of FIG. 4. The method includes provision of a buried channel layer (STEP 510). The buried channel layer can be, for example, a strained-silicon or SiGe alloy layer, as can be formed via deposition on a relaxed SiGe substrate layer that is itself disposed on a silicon substrate wafer. A spacer layer, for example, formed of a SiGe alloy, is provided adjacent to the buried channel layer (STEP 520). A strained surface layer, for example, formed of silicon, is provided adjacent to the spacer layer (STEP 530). The strained surface layer is caused to relax via dislocation multiplication and redistribution to form a relaxed surface layer (STEP 540). The relaxed surface layer can be thermally oxidized to form a dielectric layer in contact with a remaining portion of the relaxed surface layer (STEP 550). For example, a relaxed-silicon surface layer can be oxidized to form silicon dioxide.

Figure 6:
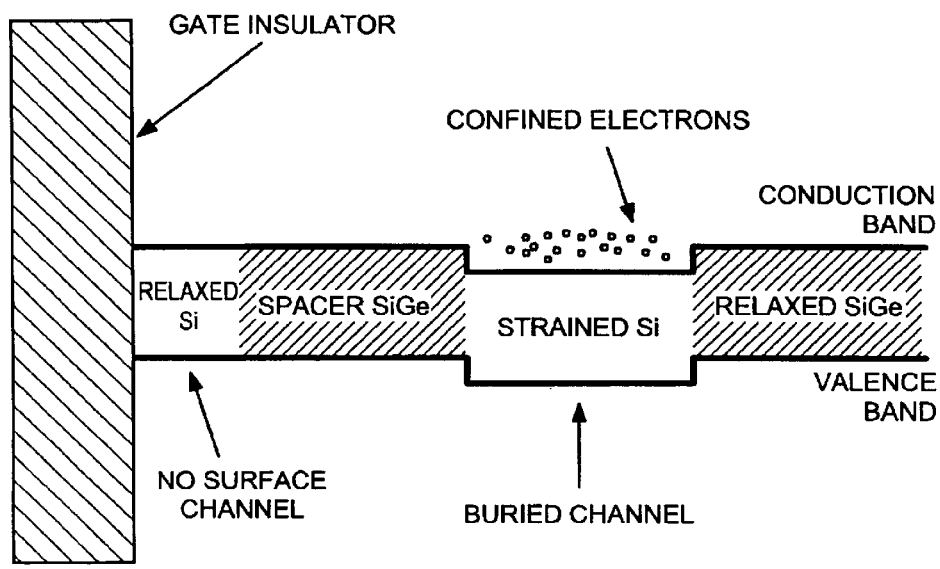
FIG. 6 is a band diagram for one illustrative implementation of the device of FIG. 4, including a SiGe spacer layer located between a relaxed silicon surface layer and a strained-silicon buried channel.

Referring now to FIG. 6, the device 400, as described with reference to FIGS. 4 and 5, has a structure that can make advantageous use of semiconductor energy bandgap offsets to substantially eliminate formation of a parasitic surface channel. FIG. 6 illustrates a band diagram for one implementation of the device 400, which includes a SiGe spacer layer located between a relaxed silicon surface layer and a strained-silicon buried channel layer. An energy band offset between the relaxed silicon surface layer and the silicon buried channel layer arises essentially from the strain differential between these two layers Preferably, the SiGe spacer layer is graded from a lower to a higher Ge concentration as the surface layer is approached, to create a zone of lateral compression in the SiGe spacer layer, immediately beneath the surface layer. The compressive zone can effectively block defects that form in the surface layer due to the strain relaxation process. In particular, propagation of dislocations from the surface layer into the buried channel layer is undesirable. Such defects in the buried-channel layer can severely degrade carrier mobility as well as other electrical characteristics.

Proper selection of layer thickness is required due to the desire to obtain relaxation of the strained silicon, which must relax to form the relaxed surface layer while keeping the buried channel layer effectively defect free. A critical thickness of the strained surface layer should be exceeded to cause relaxation of the surface layer. Simultaneously, a critical thickness of the combined thickness of the buried channel layer, spacer layer and a strained surface layer, for relaxation of the buried-channel layer, should not be exceeded.

Figure 7:
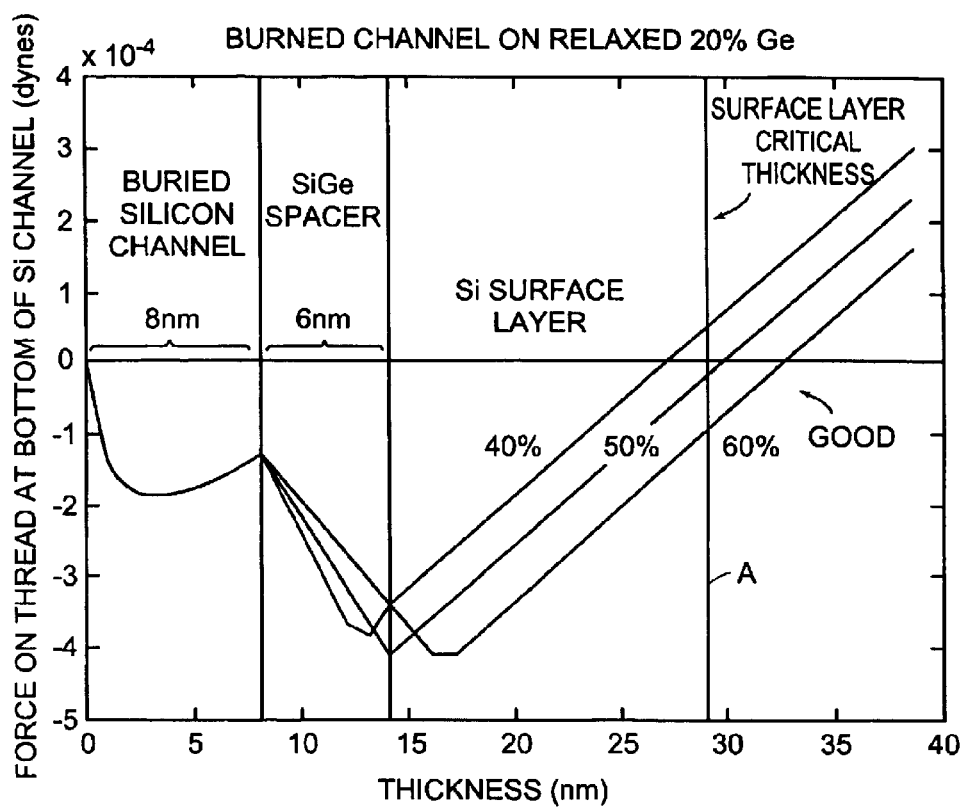
FIG. 7 is a graph of the theoretically determined force on a threading dislocation located at the bottom of a strained-silicon buried channel layer of an embodiment that includes a substrate layer having a concentration of 20 atomic % germanium.
Figure 8:
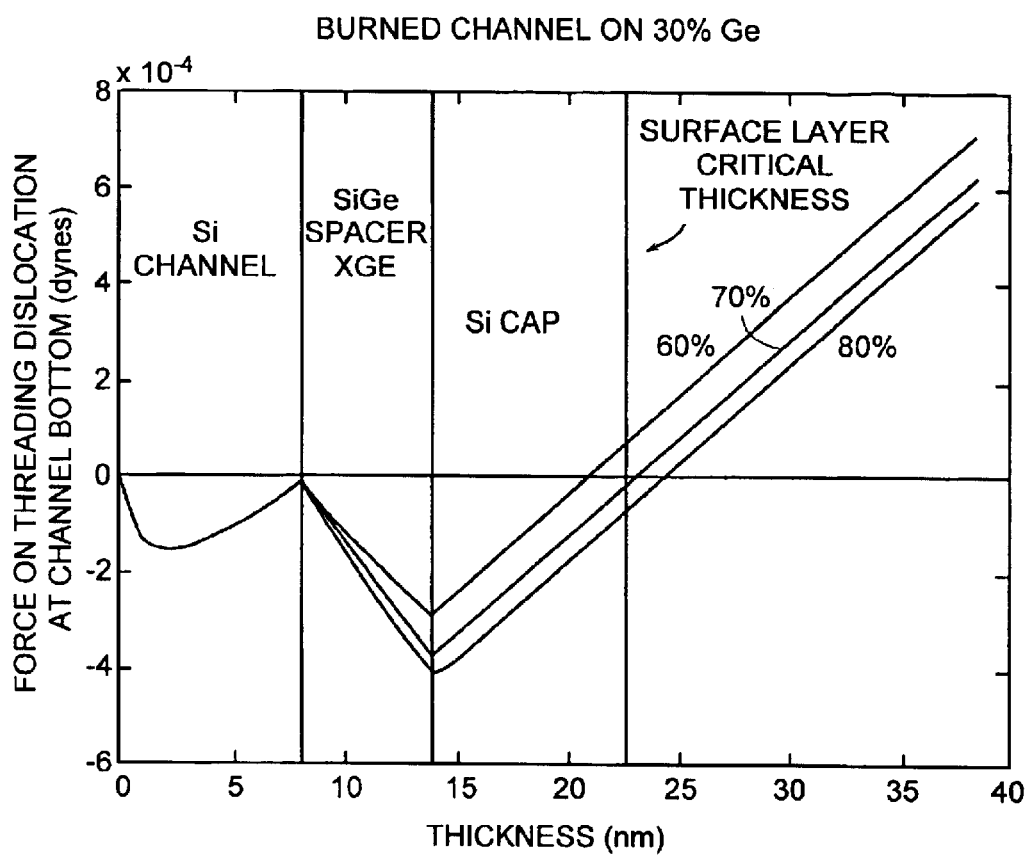
FIG. 8 is a graph of the theoretically determined force on a threading dislocation located at the bottom of a strained-silicon buried channel layer of an embodiment that includes a substrate layer having a concentration of 30 atomic % germanium.

Referring next to FIGS. 7 and 8, layer compositions and associated strains should be considered when selecting appropriate layer thicknesses. FIG. 7 illustrates the force (as theoretically determined) on a threading dislocation located at the bottom of a strained-silicon buried channel layer 410. The force calculation employed to determine the graph assumed a device implementation having a SiGe relaxed substrate layer 440 (20 atomic % germanium concentration), a strained-silicon buried channel layer 410, a SiGe spacer layer 420 and a strained-silicon surface layer (i.e., prior to relaxation). The three curves correspond to germanium concentrations in the SiGe spacer layer 420 of 40%, 50% and 60%, respectively. The SiGe spacer layer 420 was assumed to possess a uniform composition of silicon and germanium, in part, for simplicity in the calculation of the curves.

In the embodiment illustrated by FIG. 7, the strained-silicon buried layer 410 is fixed at 8 nm in thickness, and the SiGe spacer layer 420 is fixed at 6 nm in thickness.

The strained-silicon surface layer is varied in thickness in the calculation so that the critical value for the total thickness (i.e., combined thickness of all three of these layers) can be compared to the critical value for the thickness of the strained-silicon surface layer.

The force on a threading dislocation at the bottom of the buried-channel layer 410 substantially determines the critical thickness of the combined thickness of the three layers. Hence, if the force is positive (a shown in FIG. 7), then the threading dislocation would generally be expected to move, and a deleterious misfit dislocation would form at the bottom of the strained-silicon buried channel layer 410.

The critical thickness of the strained-silicon surface layer is substantially controlled by the mismatch between the lattice constant of silicon and that of the relaxed SiGe substrate layer 440. Generally, the strained-silicon surface layer must exceed its critical thickness before it will relax. In the present example, the strained-silicon surface layer has a critical thickness of approximately 15 nm (indicated by a line A in FIG. 7, at a total thickness of approximately 29 nm, i.e., 15 nm=29 nm−6 nm−8 nm). Thus, the strained silicon of the surface layer is preferably deposited at least until its thickness exceeds 15 nm, i.e., exceeds the line A. As the critical thickness is exceeded, the strained silicon can begin to relax to thus yield the relaxed-silicon surface layer 450.

An upper thickness for the strained-silicon surface layer can be chosen, for example, by assuming that the strain is maintained in the surface layer as its thickness exceeds its critical value (this assumption was employed in the calculations underlying FIG. 7). Thus, the preferred thickness regime for the strained-silicon surface layer lies between the thickness required for relaxing the surface layer, as described above, and the critical thickness for the total thickness of the three layers, also as described above.

For example, for a spacer layer 420 having a germanium concentration of 60%, the total thickness can be targeted at between 29 nm and 33 nm, i.e., 29 nm corresponding to a strained-silicon surface layer thickness of 15 nm, and 33 nm corresponding to the total thickness of the three layers at which the force on the threading dislocation becomes positive. As illustrated in FIG. 7, the example having a germanium concentration of 40% in the SiGe spacer layer 420 will experience deformation in the strained-silicon buried channel layer 410 prior to relaxation of the strained-silicon surface layer. Hence, for this implementation, a greater germanium concentration would preferably be chosen for the SiGe spacer layer 420.

In general, if the critical layer thickness of the strained-silicon surface layer 450 can be attained prior to surpassing the critical total thickness (i.e., for dislocation production within the strained-silicon buried-channel layer 410), the surface layer can relax without penetration of misfit dislocations beyond the surface layer.

For the 50% and 60% curves, it is unlikely that the total layer critical thickness would be exceeded for a real device, fabricated with the thicknesses and compositions of FIG. 7. During film deposition, the strain in the surface would typically begin to relax once the surface layer critical thickness is exceeded. The critical total thickness values would then increase as this relaxation occurs.

One could exercise extra care by, for example, epitaxially growing the surface silicon at a relatively high temperature and/or by temporarily annealing the surface layer once it exceeds its critical thickness, to promote relaxation of the surface layer. Such procedures can mitigate any metastability of a strained-silicon surface layer.

FIG. 8 illustrates the force on a threading dislocation for an embodiment similar to that of FIG. 7, however, with the relaxed SiGe substrate layer 440 having a composition of 30 atomic % germanium instead of 20%. The three curves correspond to germanium concentrations in the SiGe spacer layer 420 of 60%, 70% and 80%, respectively. The germanium concentrations are greater than those of FIG. 7, and further are chosen to maintain an effective level of compression in the SiGe spacer layer 420.

The general behavior of the misfit dislocation force is similar to that for the 20% SiGe substrate layer 440 example of FIG. 7. The process window for the surface layer thickness (i.e., the acceptable range of thicknesses), however, decreases as the SiGe substrate layer 440 germanium concentration is increased. Thus, increasing the germanium concentration in the relaxed SiGe substrate layer 440 will generally lead to a requirement of more careful control of the epitaxial growth and relaxation processes. In general, a greater germanium concentration in the spacer layer 420, for a given relaxed SiGe substrate layer 440, will be helpful.

Figure 9:
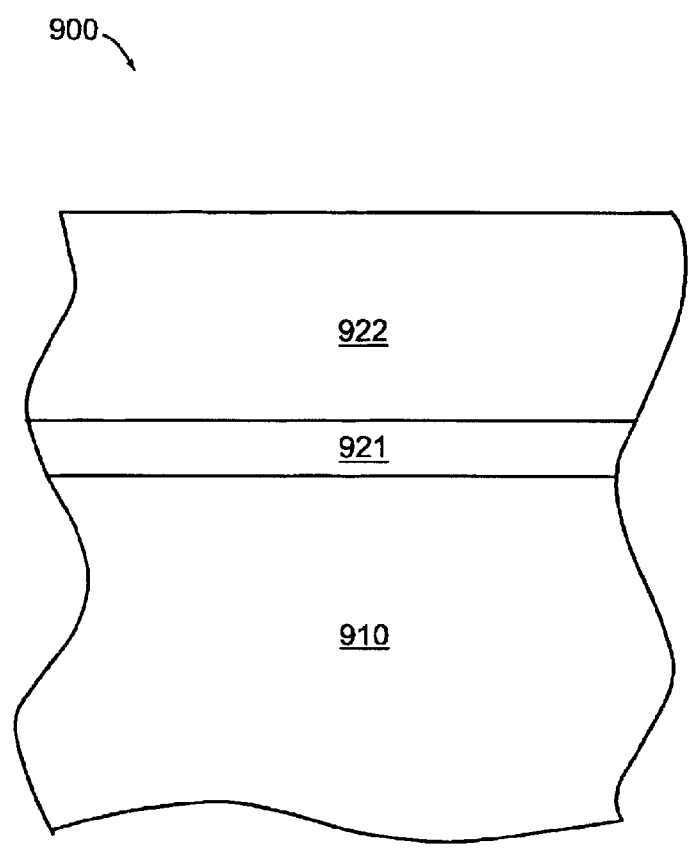
FIG. 9 is a cross-sectional view of an embodiment of a substrate for fabrication of a semiconductor-based device.
Figure 10:
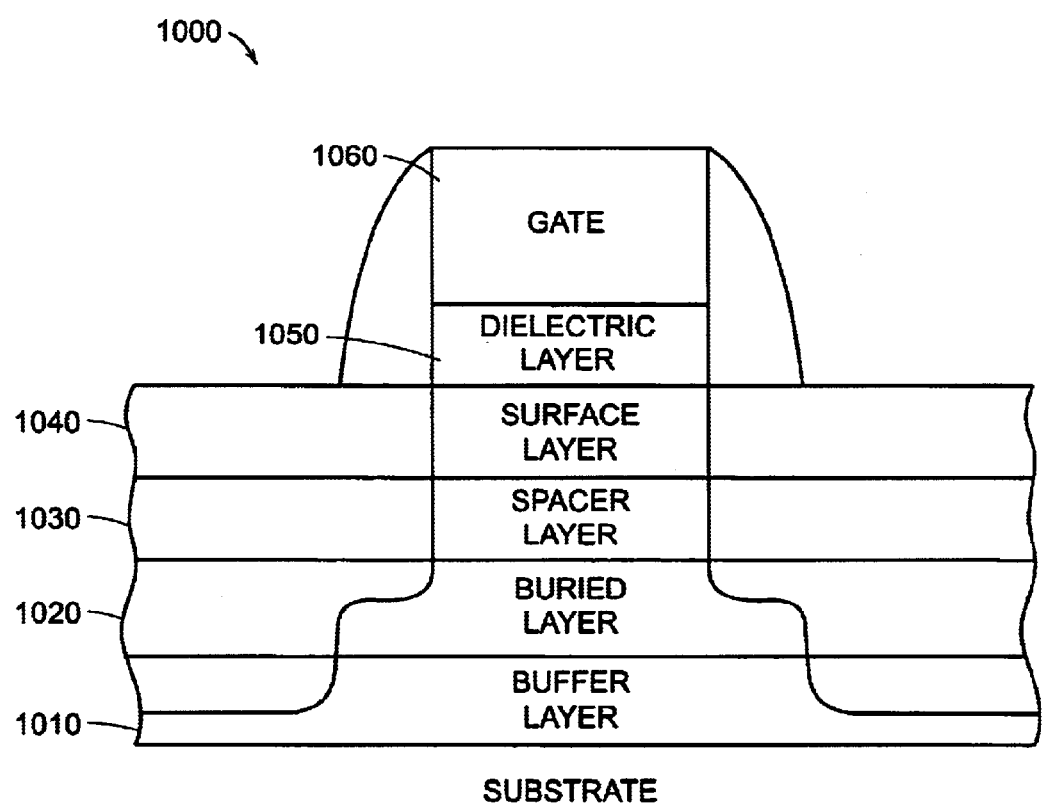
FIG. 10 is a cross-sectional view of an embodiment of a semiconductor device.

Referring to FIG. 9, another broad embodiment of the invention is described. FIG. 9 illustrates a cross-sectional view of a substrate 900 for fabrication of a semiconductor-based device. The substrate 900 includes a first layer 910 that itself includes a first material, a second layer 921 that includes the first and a second material, and a third layer that includes the first and second materials 922.

The substrate 900 can provide, for example, a lower cost substrate for fabrication of devices, such as the devices described above. Illustrative embodiments, in which the first material is silicon and the second material is germanium, are described below.

The substrate 900 can be utilized for fabrication, for example, in cases that call for a relaxed SiGe substrate layer that includes a compositionally graded SiGe layer formed on, for example, a silicon wafer. A conventional epitaxial growth process for a compositionally graded layer can be quite expensive, due to a large thickness of the epitaxial graded layer and, thus, due to a long growth time.

Reduction in the graded layer thickness can reduce the cost of manufacturing a substrate, for example, due to film growth on a silicon wafer first layer 910. To reduce a graded layer thickness, a SiGe second layer 921 preferably has a uniform composition, while the SiGe third layer 922 preferably has a graded composition. The second and third layers 921, 922 can thus yield a total thickness of a relaxed SiGe layer that provides the same upper composition, with less thickness and with adequately low defect density, as a conventionally graded SiGe layer.

For example, in a conventional graded layer, the germanium concentration can increase at approximately 10 atomic % Ge per micrometer over the full layer thickness while avoiding undesirable levels of dislocations. This rate of increase in germanium concentration leads to a requirement of 1 micrometer of film thickness to transition from a germanium concentration of 0% to 10%.

The critical thickness of a graded layer (on a silicon substrate) that has a germanium concentration gradient of 10 atomic % Ge per micrometer is generally greater than 300 nm. Further, nearly one micrometer of thickness is required to attain a thickness at which relaxation as a function of thickness is linear. Thus, the first micrometer of a graded layer can effectively be skipped without significantly affecting the final threading dislocation density in device layers formed on the substrate 900.

The second layer 921, however, preferably does not have too large an increase in germanium concentration relative to the first layer 910 (for example, more than approximately 10% germanium on a silicon wafer first layer 910). If the concentration, and related strain, is too great then the final threading dislocation density can be too high.

As an illustrative example, 2.5 micrometers of standard graded epitaxial material that gradually varies from 0% Ge to 25% Ge can be replaced by 0.2 micrometer of epitaxial material having a uniform 25% Ge concentration. In this example, however, the relatively high Ge concentration in the uniform portion can lead to a threading dislocation density in the final device layer that is unacceptably high. A lower-concentration uniform portion, however, can be tolerable. For example, 0.2 micrometer of 10% Ge has no substantial effect on the final threading dislocation density. Thus, by replacing 1.0 micrometer of graded material with 0.20 micrometer having a uniform composition of 10% Ge, 0.8 micrometer of growth can be eliminated. This reduction in overall thickness corresponds to approximately ⅓ of a conventional graded SiGe substrate layer thickness. Thus, the graded buffer cost can, for example, be reduced by approximately 30%, since the cost of growth of an epitaxial layer is generally proportional to the layer thickness.

As indicated, the various layers of the above embodiments can be formed from a variety of materials and materials compositions. In some of the described embodiments, silicon and germanium are employed. In many of these embodiments, the substrate includes a SiGe layer or multiple SiGe layers and/or graded-composition SiGe layers. A substrate can be formed, for example, from a silicon wafer, with the SiGe layers grown on the wafer. Other types of wafers can be used as a base for a substrate, e.g., silicon-on-insulator (SOI) wafers, germanium wafers, glass substrates and laminated substrates.

For example, a buried layer can be a strained silicon layer epitaxially grown on a relaxed SiGe layer. A relaxed SiGe layer can be formed via a variety of methods known to those having ordinary skill in the SiGe semiconductor substrate arts. Alternatively, a buried layer can be germanium or can be SiGe having a composition that is different from the SiGe of a relaxed layer.

For example, a buried channel layer can have a composition of $Si_{1-x}Ge_x$ while a portion of a relaxed substrate layer can have a composition of $Si_{1-y}Ge_y$. For x>y, the SiGe buried layer would be subjected to compressive stress, and would thus exhibit a compressive strain. Moreover, material combinations can be chosen to provide a p-channel MOSFET, including, for example, a compressively strained SiGe buried layer, or an n-channel MOSFET, including, for example, a tensilely strained silicon layer.

Moreover, multiple layers can be included to provide both p-channel and n-channel MOSFETs on a single substrate. For example, one set of transistors can utilize buried channel layers while the other set utilizes surface channels. Alternatively, both sets of transistors can utilize buried channel layers.

Some preferred embodiments of the invention use relaxed SiGe layers grown on silicon substrates. Silicon, germanium and SiGe layers can be grown, for example, via known epitaxial growth techniques. Growth of a buried layer of silicon, germanium or SiGe on a SiGe relaxed layer, or SiGe on silicon, can provide buried layers of controlled stress and dislocation density. Examples of SiGe substrates, in which the Ge content can be up to 100 atomic %, include:

A relaxed, uniform-composition SiGe layer on a graded composition SiGe layer atop a Si substrate.

A relaxed, uniform-composition SiGe layer directly atop a Si substrate.

A relaxed, uniform-composition SiGe layer on an insulating layer, e.g., on $SiO_2$ on a Si substrate.

Buried channel layers preferably are relatively thin. Such channel layers can be, e.g., single layers of Si, SiGe, or Ge, or a multiple-layer stack consisting of layers of Si, SiGe, or Ge.

Features of the invention can be utilized in MOSFET fabrication. One illustrative MOSFET 1000 has an area of approximately 10×100μm, and includes: a relaxed SiGe buffer layer 1010 of 30% Ge (atomic composition); a strained-Si buried layer 1020 of approximately 8 nm thickness; a SiGe spacer layer 1030 of approximately 6 nm thickness (60% Ge); a silicon surface layer 1040; a gate oxide 1050 of approximately 4 nm thickness, and a poly-silicon gate 1060.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A semiconductor-based device, comprising:
   a buried channel layer;
   a dielectric layer; and
   a compositionally graded spacer layer comprising a first material and a second material, the graded spacer layer being located between and adjacent to the buried channel layer and the dielectric layer.

2. The device of claim 1, wherein the composition of the graded spacer layer has an atomic percentage of the second material that is smaller at a location proximal to the dielectric layer than at a location distal to the dielectric layer to thereby enhance interfacial compatibility with the dielectric layer and restrict parasitic surface channel formation.

3. The device of claim 2, wherein the buried channel layer comprises the first material.

4. The device of claim 2, wherein the atomic percentage of the second material increases substantially linearly with increasing distance from the dielectric layer.

5. The device of claim 2, wherein the first material is silicon and the second material is germanium.

6. The device of claim 5, wherein the composition of the graded spacer layer at the proximal location is greater than approximately 90 atomic % Si, and at the distal location is less than approximately 40 atomic % Ge.

7. The device of claim 1, wherein the graded spacer layer is in contact with the dielectric layer.

8. The device of claim 1, further comprising a surface layer located between the dielectric layer and the graded spacer layer, the surface layer in contact with the dielectric layer and the graded spacer layer.

9. The device of claim 8, wherein the surface layer comprises strained silicon.

10. The device of claim 8, where the surface layer has a thickness of less than approximately 1 nm.

11. The device of claim 1, wherein the dielectric layer consists essentially of thermally grown silicon dioxide.

12. The device of claim 1, wherein the buried channel layer comprises strained silicon.

13. A semiconductor-based device, comprising:
    a buried channel layer;
    a relaxed surface layer; and
    a spacer layer located between the buried channel layer and the relaxed surface layer, the spacer layer having a composition that is different from a composition of the relaxed layer, the spacer layer and the relaxed surface layer each having bandgap offsets relative to the buried channel layer to reduce a parasitic channel conduction.

14. The device of claim 1, wherein the relaxed surface layer has dislocations associated with relief of stress induced at least in part by a lattice mismatch between the relaxed surface layer and a substrate layer.

15. The device of claims 14, wherein the buried channel layer is in contact with the substrate layer at an interface that is essentially free of dislocations.

16. The device of claim 14, wherein the dislocations are substantially blocked by a compressive strain of the spacer layer.

17. The device of claim 14, wherein the relaxed surface layer has a thickness greater than a critical thickness thereof to facilitate strain relaxation.

18. The device of claim 13, wherein the relaxed surface layer consists essentially of silicon.

19. The device of claim 18, further comprising a dielectric layer consisting essentially of silicon dioxide in contact with the relaxed surface layer.

20. The device of claim 13, wherein the spacer layer has a compressive strain at least in a portion of the spacer layer proximal to the relaxed surface layer.

21. The device of claim 20, wherein the spacer layer comprises a first material and a second material having a graded composition associated with the compressive strain.

22. The device of claim 21, wherein the buried channel layer comprises the first material.

23. The device of claim 13, wherein the spacer layer comprises silicon and germanium.

24. The device of claim 23, further comprising a relaxed SiGe substrate layer in contact with the buried channel layer.

25. The device of claim 24, wherein the buried channel layer comprises at least one of silicon and germanium, and has a strain associated with a lattice mismatch relative to the relaxed SiGe substrate layer.

26. The device of claim 25, wherein concentration of germanium of a portion of the spacer layer distal to the relaxed SiGe substrate layer is greater than a concentration of germanium of the relaxed SiGe substrate layer to provide a compressive strain in the portion of the spacer layer.

27. A semiconductor-based device, comprising:

a buried channel layer;

a surface layer having a bandgap offset relative to the buried channel layer to reduce a parasitic channel conduction; and a spacer layer located between the buried channel layer and the surface layer, the spacer layer having a composition that is different from a composition of the surface layer.

28. A substrate for fabrication of semiconductor-based devices, the substrate comprising:

a first layer comprising a first material;

a second layer comprising the first material and a second material, and having a substantially uniform composition, the second layer being in contact with the first layer; and a third layer comprising the first and second materials, and having a graded composition of the first and second materials, the second layer being located between the first and third layers, a composition of the third layer at a location proximal to the second layer being approximately the same as the composition of the second layer, and a concentration of the second material at a location distal to the second layer being greater than a concentration of the second material in the second layer.

29. The substrate of claim 28, wherein the first material is silicon and the second material is germanium.

30. The substrate of claim 29, wherein the first layer consists essentially of silicon.

31. The substrate of claim 28, wherein a thickness of the second layer is less than a thickness of a reference layer having a composition gradient that is the same as a composition gradient of the third layer, the reference layer having a distal composition that is the same as a composition of first layer and having a proximal composition that is the same as the composition of the third layer at the location proximal to the second layer.

32. The substrate of claim 31, wherein the first material is silicon and the second material is germanium, and the composition of the first layer is approximately 0 atomic % Ge, the composition of the second layer is approximately 10 atomic % Ge, and the composition of the third layer at the location proximal to the second layer is approximately 10 atomic % Ge.

33. The substrate of claim 28, wherein the composition of the third layer at the location distal to the second layer is greater than approximately 20 atomic % Ge.

34. The substrate of claim 28, wherein a thickness of the second layer is less than a critical thickness thereof.

35. The substrate of claim 34, wherein the first material is silicon and the second material is germanium, and the thickness of the second layer is less than approximately 0.5 micrometer.

* * * * *

(12) INTER PARTES REEXAMINATION CERTIFICATE (0117th)
United States Patent
Lochtefeld et al.

(10) Number: US 6,838,728 C1
(45) Certificate Issued: Nov. 24, 2009

(54) BURIED-CHANNEL DEVICES AND SUBSTRATES FOR FABRICATION OF SEMICONDUCTOR-BASED DEVICES

(75) Inventors: Anthony J. Lochtefeld, Cambridge, MA (US); Eugene A. Fitzgerald, Windham, NH (US)

(73) Assignee: Amberwave Systems Corporation, Salem, NH (US)

Reexamination Request:
No. 95/000,174, Aug. 16, 2006

Reexamination Certificate for:
Patent No.: 6,838,728
Issued: Jan. 4, 2005
Appl. No.: 10/216,091
Filed: Aug. 9, 2002

Related U.S. Application Data
(60) Provisional application No. 60/311,186, filed on Aug. 9, 2001.

(51) Int. Cl.
*H01L 29/02* (2006.01)
*H01L 29/80* (2006.01)
*H01L 29/165* (2006.01)
*H01L 29/10* (2006.01)
*H01L 21/337* (2006.01)
*H01L 29/66* (2006.01)
*H01L 21/02* (2006.01)

(52) U.S. Cl. ............... 257/325; 257/758; 257/E29.056; 257/E21.448; 257/E29.315; 257/E29.085

(58) Field of Classification Search ........................ None
See application file for complete search history.

(56) References Cited

PUBLICATIONS

Welser, J., et al., "Evidence of Real–Space Hot–Electron Transfer in High Mobility, Strained–Si Multilayer MOSFETS," IEEE IEDM TECH. DIG., pp. 554–548, Dec. 1993.*
A. Sadek et al. entitled "Design of Si/SiGe Heterojunction Complementary Metal–Oxide–Semiconductor Transistors", IEEE Transactions on Electron Devices, vol. 43 No. 8 (Aug. 1996).*
S. Wolf and R.N. Tauber entitled Silicon Processing for the VSI Era, vol. 1: Process Technology, Chapter 7, pp. 198–241 (Lattice Press 1986).*
The American Heritage Dictionary.*

* cited by examiner

*Primary Examiner*—Erik Kielin

(57) ABSTRACT

Semiconductor-based devices, and methods for making the devices, involve a first device that includes a buried channel layer, a dielectric layer, and a compositionally graded spacer layer. The spacer layer includes a first material and a second material, and is located between the buried channel layer and the dielectric layer. A second device includes a buried channel layer, a relaxed surface layer, and a spacer layer located between the buried channel layer and the relaxed surface layer. The spacer layer has a composition that is different from a composition of the relaxed layer. The spacer layer and the relaxed surface layer each have bandgap offsets relative to the buried channel layer to reduce a parasitic channel conduction. A substrate for fabrication of devices, and methods for making the substrate, involves a substrate that includes a first layer, such as a silicon wafer, a substantially uniform second layer, and a graded-composition third layer.

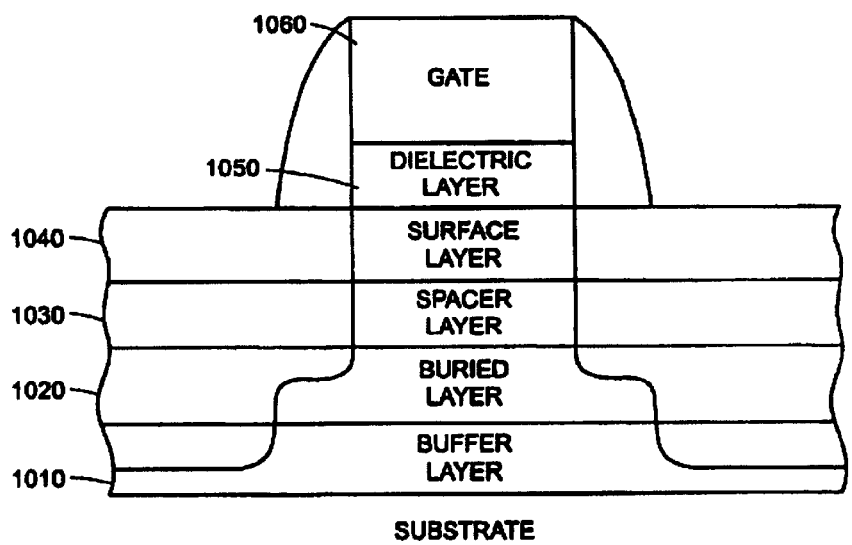

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 7–10 are cancelled.

Claims 1, 4, and 6 are determined to be patentable as amended.

Claims 2, 3, 5, 11 and 12, dependent on an amended claim, are determined to be patentable.

New claims 36–43 are added and determined to be patentable.

Claims 13–35 were not reexamined.

1. A semiconductor-based device, comprising:
   a buried channel layer;
   a dielectric layer; and
   a compositionally graded spacer layer comprising a first material and a second material; the graded spacer layer being located between and adjacent to the buried channel layer and the dielectric layer,
   *wherein the graded spacer layer is in contact with the dielectric layer.*

4. [The] *A semiconductor-based* device [of claim 2], *comprising:*
   *a buried channel layer;*
   *a dielectric layer; and*
   *a compositionally graded spacer layer comprising a first material and a second material, the graded spacer layer being located between and adjacent to the buried channel layer and the dielectric layer,*
   wherein *the composition of the graded spacer layer has an atomic percentage of the second material that is smaller at a location proximal to the dielectric layer than at a location distal to the dielectric layer to thereby enhance interfacial compatibility with the dielectric layer and restrict parasitic surface channel formation, and* the atomic percentage of the second material increases substantially linearly with increasing distance from the dielectric layer.

6. [The] *A semiconductor-based* device [of claim 5], *comprising:*
   a buried channel layer;
   a dielectric layer, and
   a compositionally graded spacer layer comprising a first material and a second material, the graded spacer layer being located between and adjacent to the buried channel layer and the dielectric layer,
   wherein *the composition of the graded spacer layer has an atomic percentage of the second material that is smaller at a location proximal to the dielectric layer than at a location distal to the dielectric layer to thereby enhance interfacial compatibility with the dielectric layer and restrict parasitic surface channel formation, the first material is silicon and the second material is germanium, and* the composition of the graded spacer layer at the proximal location is greater than approximately 90 atomic % [Si], *silicon* and at the distal location is less than approximately 40 atomic % [Ge] *germanium* .

36. *A semiconductor-based device, comprising:*
    *a buried channel layer;*
    *a dielectric layer; and*
    *a compositionally graded spacer layer comprising a first material and a second material, the graded spacer layer being located between and adjacent to the buried channel layer and the dielectric layer,*
    *wherein the composition of the graded spacer layer has an atomic percentage of the second material that is smaller at a location proximal to the dielectric layer than at a location distal to the dielectric layer, the atomic percentage of the second material at the proximal location being approximately equal to zero.*

37. *The semiconductor-based device of claim 36, wherein the atomic percentage of the second material increases substantially linearly with increasing distance from the dielectric layer.*

38. *The semiconductor-based device of claim 36, wherein the first material is silicon and the second material is germanium.*

39. *The semiconductor-based device of claim 36, wherein the graded spacer layer is in contact with the dielectric layer.*

40. *The semiconductor-based device of claim 36, further comprising a surface layer located between the dielectric layer and the graded spacer layer, wherein the surface layer is in contact with the dielectric layer and the graded spacer layer.*

41. *The seniconductor-based device of claim 40, wherein the surface layer comprises strained silicon.*

42. *The semiconductor-based device of claim 40, wherein the surface layer has a thickness of less than approximately 1 nm.*

43. *The semiconductor-based device of claim 36, wherein the buried channel layer comprises strained silicon.*

\* \* \* \* \*